United States Patent
Chang et al.

(10) Patent No.: US 9,966,364 B2
(45) Date of Patent: May 8, 2018

(54) SEMICONDUCTOR PACKAGE AND METHOD FOR FABRICATING THE SAME

(71) Applicant: Samsung Electronics Co., Ltd., Suwon-si, Gyeonggi-do (KR)

(72) Inventors: Gun Ho Chang, Yongin-si (KR); Jong Bo Shim, Asani-si (KR); Cha Je Jo, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days. days.

(21) Appl. No.: 15/435,285

(22) Filed: Feb. 16, 2017

(65) Prior Publication Data

US 2018/0040590 A1 Feb. 8, 2018

(30) Foreign Application Priority Data

Aug. 4, 2016 (KR) ........................ 10-2016-0099374

(51) Int. Cl.
| | |
|---|---|
| *H01L 29/40* | (2006.01) |
| *H01L 25/065* | (2006.01) |
| *H01L 23/00* | (2006.01) |
| *H01L 25/00* | (2006.01) |

(52) U.S. Cl.
CPC .......... *H01L 25/0657* (2013.01); *H01L 24/03* (2013.01); *H01L 24/09* (2013.01);
(Continued)

(58) Field of Classification Search
CPC ..... H01L 25/0657; H01L 24/09; H01L 25/50; H01L 24/03; H01L 2224/0912;
(Continued)

(56) References Cited

U.S. PATENT DOCUMENTS

| | | |
|---|---|---|
| 7,098,528 B2 | 8/2006 | Vasishta et al. |
| 7,453,143 B2 | 11/2008 | Dutta |

(Continued)

FOREIGN PATENT DOCUMENTS

| | | |
|---|---|---|
| KR | 101237587 B1 | 2/2013 |
| KR | 20140082305 A | 7/2014 |

*Primary Examiner* — Xinning Niu
*Assistant Examiner* — Vu A Vu
(74) *Attorney, Agent, or Firm* — Renaissance IP Law Group LLP

(57) ABSTRACT

A semiconductor package comprising: a substrate including an external connection terminal and a cavity; a first semiconductor chip disposed in the cavity, the first semiconductor chip including a first pad and a second pad different from the first pad, the first pad and the second pad being disposed on a first surface of the first semiconductor chip; a metal line disposed on the substrate and the first semiconductor chip and electrically connecting the first pad of the first semiconductor chip with the external connection terminal of the substrate; a second semiconductor chip disposed on the first semiconductor chip, the second semiconductor chip including a third pad disposed on a second surface of the second semiconductor chip facing the first semiconductor chip; and a connection terminal electrically connecting the second pad of the first semiconductor chip with the third pad of the second semiconductor chip, the connection terminal being not electrically connected to the metal line.

19 Claims, 15 Drawing Sheets

(52) U.S. Cl.
CPC ...... *H01L 25/50* (2013.01); *H01L 2224/0912* (2013.01); *H01L 2225/0652* (2013.01); *H01L 2225/06513* (2013.01); *H01L 2225/06524* (2013.01); *H01L 2225/06544* (2013.01); *H01L 2225/06555* (2013.01)

(58) Field of Classification Search
CPC . H01L 2225/06555; H01L 2225/06524; H01L 2225/06513; H01L 2225/0652; H01L 2225/06544
USPC .......................................................... 257/774
See application file for complete search history.

(56) References Cited

U.S. PATENT DOCUMENTS

| | | | |
|---|---|---|---|
| 7,719,105 B2 | 5/2010 | Dutta | |
| 8,334,174 B2 | 12/2012 | Chang et al. | |
| 8,349,649 B2* | 1/2013 | Kurita | H01L 23/3121 257/686 |
| 9,202,716 B2 | 12/2015 | Park et al. | |
| 9,202,782 B2 | 12/2015 | Chuah | |
| 2008/0116564 A1 | 5/2008 | Yang et al. | |
| 2008/0136002 A1 | 6/2008 | Yang | |
| 2008/0136004 A1* | 6/2008 | Yang | H01L 24/96 257/686 |
| 2008/0157316 A1* | 7/2008 | Yang | H01L 24/24 257/685 |
| 2008/0174008 A1 | 7/2008 | Yang et al. | |
| 2008/0197469 A1* | 8/2008 | Yang | H01L 25/0652 257/686 |
| 2008/0217761 A1 | 9/2008 | Yang et al. | |
| 2008/0224306 A1* | 9/2008 | Yang | H01L 24/24 257/725 |
| 2008/0258286 A1* | 10/2008 | Gerber | H01L 25/105 257/686 |

\* cited by examiner

SEMICONDUCTOR PACKAGE AND METHOD FOR FABRICATING THE SAME

CROSS-REFERENCE TO RELATED APPLICATION

This application claims priority from Korean Patent Application No. 10-2016-0099374 filed on Aug. 4, 2016 in the Korean Intellectual Property Office, and all the benefits accruing therefrom under 35 U.S.C. 119, the contents of which in its entirety are herein incorporated by reference.

BACKGROUND

1. Technical Field

Embodiments relate to a semiconductor package and a method for fabricating the same.

2. Description of the Related Art

With the recent trend of miniaturized high-performance semiconductor devices, it is becoming important to form fine wiring in a semiconductor chip package. However, when a semiconductor chip having fine wiring is mounted on a printed circuit board, forming wiring on the printed circuit board corresponding to the fine wiring of the semiconductor chip may be difficult.

SUMMARY

Embodiments include a semiconductor package comprising: a substrate including an external connection terminal and a cavity; a first semiconductor chip disposed in the cavity, the first semiconductor chip including a first pad and a second pad different from the first pad, the first pad and the second pad being disposed on a first surface of the first semiconductor chip; a metal line disposed on the substrate and the first semiconductor chip and electrically connecting the first pad of the first semiconductor chip with the external connection terminal of the substrate; a second semiconductor chip disposed on the first semiconductor chip, the second semiconductor chip including a third pad disposed on a second surface of the second semiconductor chip facing the first semiconductor chip; and a connection terminal electrically connecting the second pad of the first semiconductor chip with the third pad of the second semiconductor chip, the connection terminal being not electrically connected to the metal line.

Embodiments include a semiconductor package comprising: a substrate including a cavity; a first semiconductor chip disposed in the cavity, the first semiconductor chip including a first pad, a second pad, and a third pad disposed on an upper surface of the first semiconductor chip, wherein the second pad and the third pad different from the first pad; a metal line disposed on the substrate and the first semiconductor chip and electrically connected to the first pad of the first semiconductor chip and the substrate; a second semiconductor chip disposed on the first semiconductor chip and electrically connected to the first semiconductor chip through a first connection terminal connected to the second pad; and a third semiconductor chip disposed on the first semiconductor chip, spaced apart from the second semiconductor chip, and electrically connected to the first semiconductor chip through a second connection terminal connected to the third pad, wherein the metal line does not contact the first connection terminal and the second connection terminal.

Embodiments include a semiconductor package, comprising: a substrate; a first semiconductor chip including a first pad and at least one second pad; at least one second semiconductor chip disposed on the first semiconductor chip, wherein each of the at least one second semiconductor chip is electrically connected to the first semiconductor chip through a corresponding one of the at least one second pad; and a metal line electrically connected to the first pad; wherein the first semiconductor chip and the at least one second semiconductor chip are not electrically connected through the metal line.

BRIEF DESCRIPTION OF THE DRAWINGS

Embodiments will be described with reference to the attached drawings, in which.

DETAILED DESCRIPTION OF THE EMBODIMENTS

Figure 1:
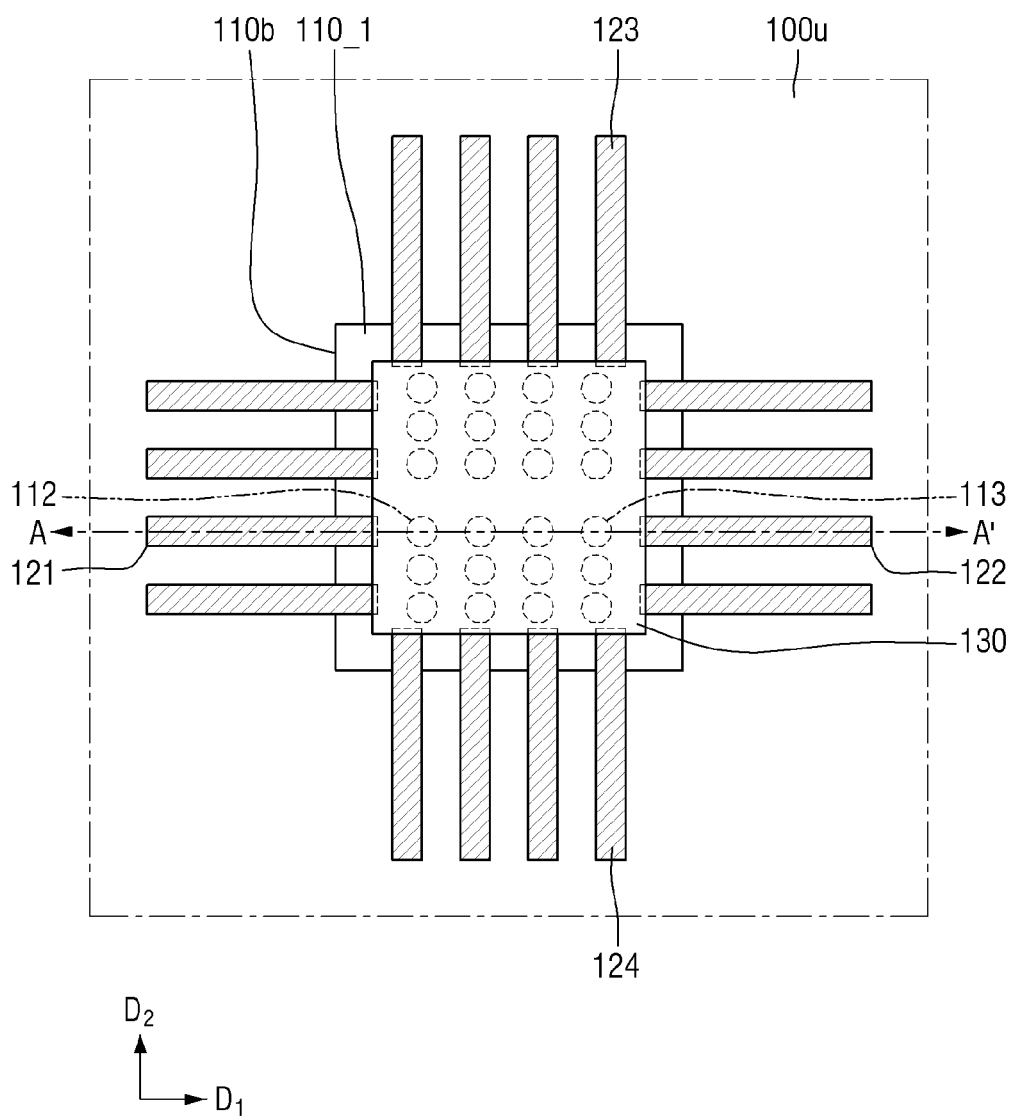
FIG. 1 is a top view of a semiconductor package according to some embodiments.
Figure 2:
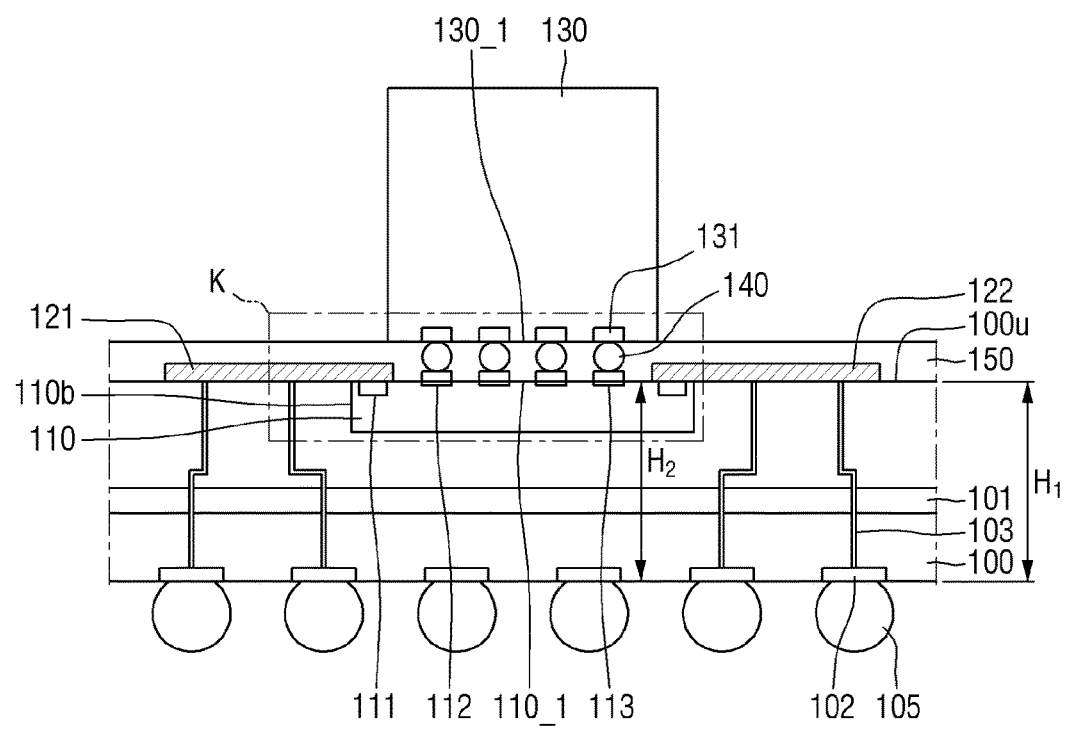
FIG. 2 is a cross-sectional view taken along line A-A' of FIG. 1.
Figure 3:
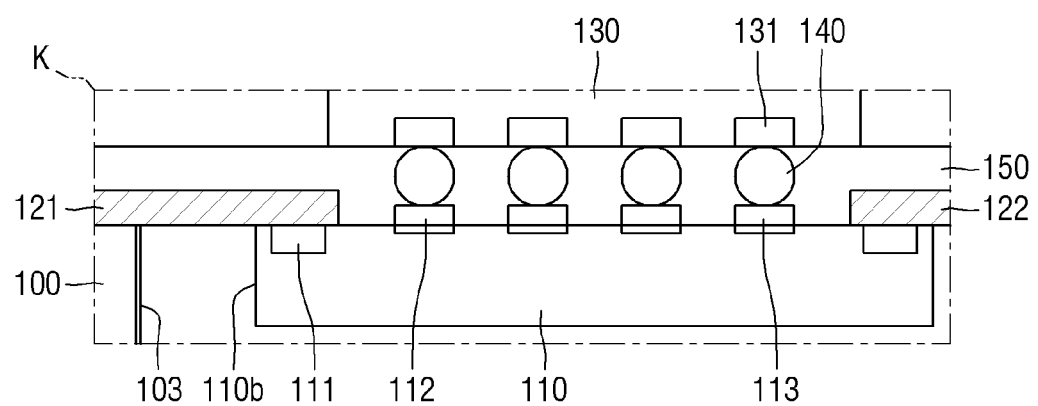
FIG. 3 is an enlarged view of area K of FIG. 2.

FIG. 1 is a top view of a semiconductor package according to some embodiments. FIG. 2 is a cross-sectional view taken along line A-A' of FIG. 1. FIG. 3 is an enlarged view of area K of FIG. 2. Referring to FIGS. 1 and 2, a semiconductor package according to some embodiments may include first to fourth metal lines 121 to 124, second pads 112 and third pads 113.

A substrate 100 may be a substrate for a semiconductor package. The substrate 100 may be, for example, a printed circuit board (PCB), a lead frame (LF), a ceramic substrate, a silicon wafer or a wiring board. The printed circuit board may include a rigid printed circuit board (Rigid PCB), a flexible printed circuit board (Flexible PCB), or a rigid flexible printed circuit board (Rigid Flexible PCB).

The substrate 100 may include a core board 101, lower pads 102 and vias 103. The lower pads 102 may be disposed below the core board 101. The lower pads 102 may be disposed on one surface of the substrate 100. Although a predetermined number of lower pads 102 are illustrated as being disposed on one surface of the substrate 100, other embodiments may be different. For example, the number of the lower pads 102 may be increased or decreased as needed.

The vias 103 may be connected to the lower pads 102 from an upper surface 100U of the substrate 100. The vias 103 may be formed through the substrate 100. Further, the vias 103 may be formed through the core board 101. The shape and/or routing of the vias 103 are not limited to that shown in the drawings. For example, the shape and/or routing of the vias 103 may be different than that shown in the drawings, depending on a process used to form the vias 103.

The vias 103 may be connected to, for example, some of the lower pads 102. In other words, all of the lower pads 102 may not be connected to all of the vias 103. However, other embodiments may be different. For example, in some embodiments, all of the lower pads 102 may be connected to all of the vias 103 while in other embodiments, some of the lower pads 102 may not be connected to any of the vias 103.

The lower pads 102 and the vias 103 may include a conductive material. For example, the lower pads 102 and the vias 103 may include gold (Au), silver (Ag), copper (Cu), nickel (Ni) or aluminum (Al).

The lower pads 102 and the vias 103 may electrically connect the elements disposed on the substrate 100 with external connection terminals 105. The lower pads 102 may serve to electrically connect the external connection terminals 105 with the substrate 100.

The external connection terminals 105 may be disposed on one surface of the substrate 100. The external connection terminals 105 may be disposed, for example, on a lower surface of the substrate 100. The external connection terminals 105 may be, for example, in contact with the lower pads 102. The external connection terminals 105 may be electrically connected or connectable to the external elements. For example, the external connection terminals 105 may be configured to electrically connect the semiconductor package including the substrate 100 with another semiconductor package. Alternatively, the external connection terminals 105 may be configured to electrically connect the semiconductor package including the substrate 100 with, for example, another semiconductor device.

Although it has been illustrated in the drawings that the external connection terminals 105 are solder balls, other embodiments may be different. For example, the external connection terminals 105 may include solder bumps, grid arrays, or conductive tabs or the like.

Multiple external connection terminals 105 may be formed on one surface (e.g., a lower surface) of the substrate 100.

In some embodiments, if the vias 103 are electrically connected to the elements disposed on the upper surface 100U of the substrate 100, upper pads may be further disposed between the vias 103 and the elements. In other words, for example, the vias 103 may be formed to be connected from the upper pads to the lower pads 102 so as to pass through the substrate 100.

The upper pads may be disposed on the upper surface 100U of the substrate 100. Alternatively, the upper pads may be disposed, for example, immediately below the upper surface 100U of the substrate 100, i.e., disposed inside the substrate 100. Alternatively, the upper pads may be formed to pass through the upper surface 100U of the substrate 100. In this case, a portion of the upper pads may protrude from the upper surface 100U of the substrate 100, and the remaining portion of the upper pads may be formed inside the substrate 100.

The substrate 100 may include a cavity 100-c therein, which will be described with reference to FIG. 9. A first semiconductor chip 110 may be disposed in the substrate 100. In other words, the first semiconductor chip 110 may be disposed in the cavity 100-c formed in the substrate 100. The details about the cavity 100-c will be described below.

As the first semiconductor chip 110 is disposed in the cavity 100-c in the substrate 100, a height H1 from one surface (e.g., the lower surface) of the substrate 100 to the upper surface 100U of the substrate 100 may be substantially equal to a height H2 from one surface of the substrate 100 to an upper surface (e.g., a first surface) 110_1 of the first semiconductor chip 110. In some embodiments, the height H1 may be equal to the height H2 within manufacturing tolerances of associated components. That is, the height H1 may be referred to as being equal to the height H2, but may not be exactly the same.

The first surface 110_1 of the first semiconductor chip 110 and the upper surface 100U of the substrate 100 may be placed, for example, on substantially the same plane. However, other embodiments may be different and, for example, the height H1 and the height H2 may be different from each other.

The first semiconductor chip 110 may be, for example, a logic chip. However, in other embodiments, the first semiconductor chip 110 may be a different type of semiconductor chip.

The first semiconductor chip 110 may be disposed in the cavity 100-c of the substrate 100 so as to expose the first surface 110_1. On the first surface 110_1 of the first semiconductor chip 110, first pads 111, the second pads 112 and the third pads 113 may be disposed.

The first pads 111 may be disposed, for example, in the first semiconductor chip 110. However, other embodiments may be different and, for example, some or all of the first pads 111 may protrude beyond the upper surface 100U of the substrate 100.

The second pads 112 and the third pads 113 may be disposed on the first surface 110_1 of the first semiconductor chip 110. Although it has been illustrated in the drawings that some of the second pads 112 and the third pads 113 protrude beyond the upper surface 100U of the substrate 100, other embodiments may be different. For example, all of the second pads 112 and the third pads 113 may protrude from the upper surface 100U of the substrate 100. Alternatively, for example, all of the second pads 112 and the third pads 113 may be disposed in the first semiconductor chip 110, and only the upper surfaces of the second pads 112 and the third pads 113 may be exposed. These second pads 112 and third pads 113 may not protrude beyond the upper surface 100U of the substrate 100.

The second pads 112 and the third pads 113 may be formed separately from each other. Further, the second pads 112 and the third pads 113 may be formed separately from the first pads 111.

In some embodiments, if the second pads 112 and the third pads 113 are disposed on the first surface 110_1 of the first semiconductor chip 110, another component may not be interposed between the first surface 110_1 of the first semiconductor chip 110 and the second pads 112 and the third pads 113.

Multiple second pads 112 and the third pads 113 may be arranged on the first surface 110_1 of the first semiconductor chip 110. The second pads 112 and the third pads 113 may be disposed on the first surface 110_1 of the first semiconductor chip 110 so as not to overlap with the first to fourth metal lines 121 to 124. The details about the first to fourth metal lines 121 to 124 will be described later.

Although it has been illustrated in the drawings that a predetermined number of pads including the second pads 112 and the third pads 113 are disposed on the first surface 110_1 of the first semiconductor chip 110, other embodiments may be different. For example, any number of the second pads 112 and the third pads 113 may be disposed on the first surface 110_1 of the first semiconductor chip 110.

The second pads 112 and the third pads 113 may include, a conductive material, e.g., a metal material. The second pads 112 and the third pads 113 may include, for example, nickel (Ni) and/or gold (Au).

The first pads 111, the second pads 112 and the third pads 113 may be different from each other. For example, the functions of the first pads 111, the second pads 112 and the third pads 113 may be different from each other. In some embodiments, the first pads 111 may serve to electrically connect the substrate 100 with the first semiconductor chip 110. However, the second pads 112 and the third pads 113 may serve to electrically connect the first semiconductor chip 110 with another semiconductor chip (e.g., a second semiconductor chip 130).

The first to fourth metal lines 121 to 124 may be disposed on the substrate 100 and the first semiconductor chip 110. For example, the first to fourth metal lines 121 to 124 may be disposed over the upper surface 100U of the substrate 100 and the first surface 110_1 of the first semiconductor chip 110. The first to fourth metal lines 121 to 124 may be disposed on a portion of the first surface 110_1 of the first semiconductor chip 110 and the upper surface 100U of the substrate 100. For example, a portion of the first metal line 121 may be disposed on the first surface 110_1 of the first semiconductor chip 110 and the first pads 111. The remaining portion of the first metal line 121 may be disposed on the upper surface 100U of the substrate 100.

For example, a portion of the first metal line 121 may be disposed in contact with the first surface 110_1 of the first semiconductor chip 110 and the first pads 111. The remaining portion of the first metal line 121 may be disposed in contact with the upper surface 100U of the substrate 100.

The first to fourth metal lines 121 to 124 may be disposed on a boundary 100b between the substrate 100 and the sidewall of the first semiconductor chip 110. The sidewall of the first semiconductor chip 110 may be substantially perpendicular to the upper surface 100U of the substrate 100. For example, the sidewall of the first semiconductor chip 110 may extend in a direction crossing the plane on which the upper surface 100U of the substrate 100 is placed. The lower surface of the first semiconductor chip 110 may be substantially parallel to the upper surface 100U of the substrate 100. For example, the lower surface of the first semiconductor chip 110 may extend to be substantially parallel to the plane on which the upper surface 100U of the substrate 100 is placed.

The first metal line 121 and the second metal line 122 may be spaced apart from the second pads 112 and the third pads 113. In other words, the first to fourth metal lines 121 to 124 may be spaced apart from multiple pads, including the second pads 112 and the third pads 113, disposed on the first surface 110_1 of the first semiconductor chip 110.

For example, the second pads 112 and the third pads 113 may be disposed between the first metal line 121 and the second metal line 122.

The first metal line 121 and the second metal line 122 may be disposed to extend in a first direction D1. A third metal line 123 and a fourth metal line 124 may be disposed to extend in a second direction D2 crossing the first direction D1. That is, the first to fourth metal lines 121 to 124 may be disposed along a boundary 110b between the substrate 100 and the sidewall of the first semiconductor chip 110.

Although it has been illustrated in the drawings that a predetermined number of metal lines are disposed on the substrate 100 and the first semiconductor chip 110, other embodiments may be different. For example, in other embodiments may include a different number of metal lines. Moreover, in other embodiments, the metal lines may be disposed in different orientations and configurations.

In some embodiments, a material included in the first to fourth metal lines 121 to 124 may be different from a material included in the second pads 112 and the third pads 113. For example, the first to fourth metal lines 121 to 124 may include copper while the second pads 112 and the third pads 113 may not include copper.

In the semiconductor package according to some embodiments, by making the material included in the first to fourth metal lines 121 to 124 different from the material included in the second pads 112 and the third pads 113, it is possible to increase the reliability between a first connection terminal 140 and the second pads 112 and between the first connection terminal 140 and the third pads 113. The details about the first connection terminal 140 will be described later.

The second semiconductor chip 130 may be disposed on the first semiconductor chip 110. That is, the first semiconductor chip 110 and the second semiconductor chip 130 may be stacked vertically with respect to the upper surface 100U of the substrate 100. For example, the second semiconductor chip 130 may be disposed on the second pads 112 and the third pads 113 disposed on the first surface 110_1 of the first semiconductor chip 110.

The second semiconductor chip 130 may be mounted on the substrate 100, for example, in the form of a flip chip.

The second semiconductor chip 130 may be a NAND flash chip, a Dynamic Random Access Memory (DRAM), a flash memory chip, or a resistance changeable memory chip. In some embodiments, the second semiconductor chip 130 may be a DRAM.

The second semiconductor chip 130 may include a second surface 130_1 facing the first surface 110_1 of the first semiconductor chip 110. Fourth pads 131 may be disposed on the second surface 130_1 of the second semiconductor chip 130. The fourth pads 131 may be disposed, for example, inside the second semiconductor chip 130. However, other embodiments may be different. For example, some or all of the fourth pads 131 may protrude from or through the second surface 130_1 of the second semiconductor chip 130.

The fourth pads 131 may include a conductive material.

The second semiconductor chip 130 may be electrically connected to the first semiconductor chip 110 through the first connection terminal 140 connected to the second pads 112. For example, the first connection terminal 140 may electrically connect the second pads 112 of the first semiconductor chip 110 with the fourth pads 131 of the second semiconductor chip 130.

In some embodiments, the first connection terminal 140 may not be electrically connected to the first to fourth metal lines 121 to 124. For example, the first connection terminal 140 may be in non-contact (i.e., may not be in contact) with the first to fourth metal lines 121 to 124. That is, all of the connection terminals including the first connection terminal 140, disposed between the first semiconductor chip 110 and the second semiconductor chip 130, may not be in contact with the first to fourth metal lines 121 to 124.

The first semiconductor chip 110 and the second semiconductor chip 130 may be electrically connected to each other through the second pads 112 (or the third pads 113), the first connection terminal 140 and the fourth pads 131. In addition, a route for electrical connection between the first semiconductor chip 110 and the second semiconductor chip 130 may not include the first to fourth metal lines 121 to 124.

The first connection terminal 140 may be, for example, a solder ball, a solder bump, a combination thereof, or another similar structure configured to connect pads of semiconductor chips.

The first connection terminal 140 may be disposed on the second pads 112. The second semiconductor chip 130 may be disposed on the first connection terminal 140.

Referring to FIG. 3, in some embodiments, the first connection terminal 140 may be in contact with the fourth pads 131 of the second semiconductor chip 130. Further, the first connection terminal 140 may be in contact with the second pads 112.

The first semiconductor chip 110 may be electrically connected to the second semiconductor chip 130 through the second pads 112, the first connection terminal 140 and the fourth pads 131. In other words, the first semiconductor chip 110 and the second semiconductor chip 130 may be electrically connected to each other, for example, by direct bonding.

If the first semiconductor chip 110 and the second semiconductor chip 130 are electrically connected to each other, for example, through another medium, an RC delay and a signal delay may occur. In the semiconductor package described herein according to some embodiments, by directly bonding the first semiconductor chip 110 and the second semiconductor chip 130 through pads disposed on the first surface 110_1 of the first semiconductor chip 110, it is possible to reduce the RC delay and the signal delay. Also, it is possible to reduce the thickness and the size of the semiconductor package. Further, in the semiconductor package according to some embodiments, by directly bonding the first semiconductor chip 110 and the second semiconductor chip 130 through pads disposed on the first surface 110_1 of the first semiconductor chip 110, it is possible to improve the speed and reduce the power loss. Further, in the semiconductor package according to some embodiments, by electrically connecting the first semiconductor chip 110 and the second semiconductor chip 130 without using the first to fourth metal lines 121 to 124, costs may be reduced because a separate medium containing fine wiring is not used.

Referring to FIGS. 1-3, the first semiconductor chip 110 may be electrically connected to the substrate 100 through the first to fourth metal lines 121 to 124. Specifically, the first metal line 121 may be electrically connected to the first semiconductor chip 110. Further, the first metal line 121 may be electrically connected to the substrate 100.

The first metal line 121 may electrically connect the first pads 111 of the first semiconductor chip 110 with the external connection terminals 105 of the substrate 100. For example, the first metal line 121 may be in contact with the first pads 111 of the first semiconductor chip 110.

An insulating film 150 may be disposed on the first surface 110_1 of the first semiconductor chip 110. The second pads 112, the third pads 113 and the fourth pads 131 may be disposed in the insulating film 150. In some embodiments, the insulating film 150 may be extended onto the upper surfaces of the first to fourth metal lines 121 to 124 and the upper surface 100U of the substrate 100.

The insulating film 150 may include an insulating material which can electrically isolate one component from another component.

Some to all of the components disposed on the substrate 100 may be disposed in a mold layer. The mold layer may cover the upper surface 100U of the substrate 100. The mold layer may include, for example, a molding compound.

Figure 4:
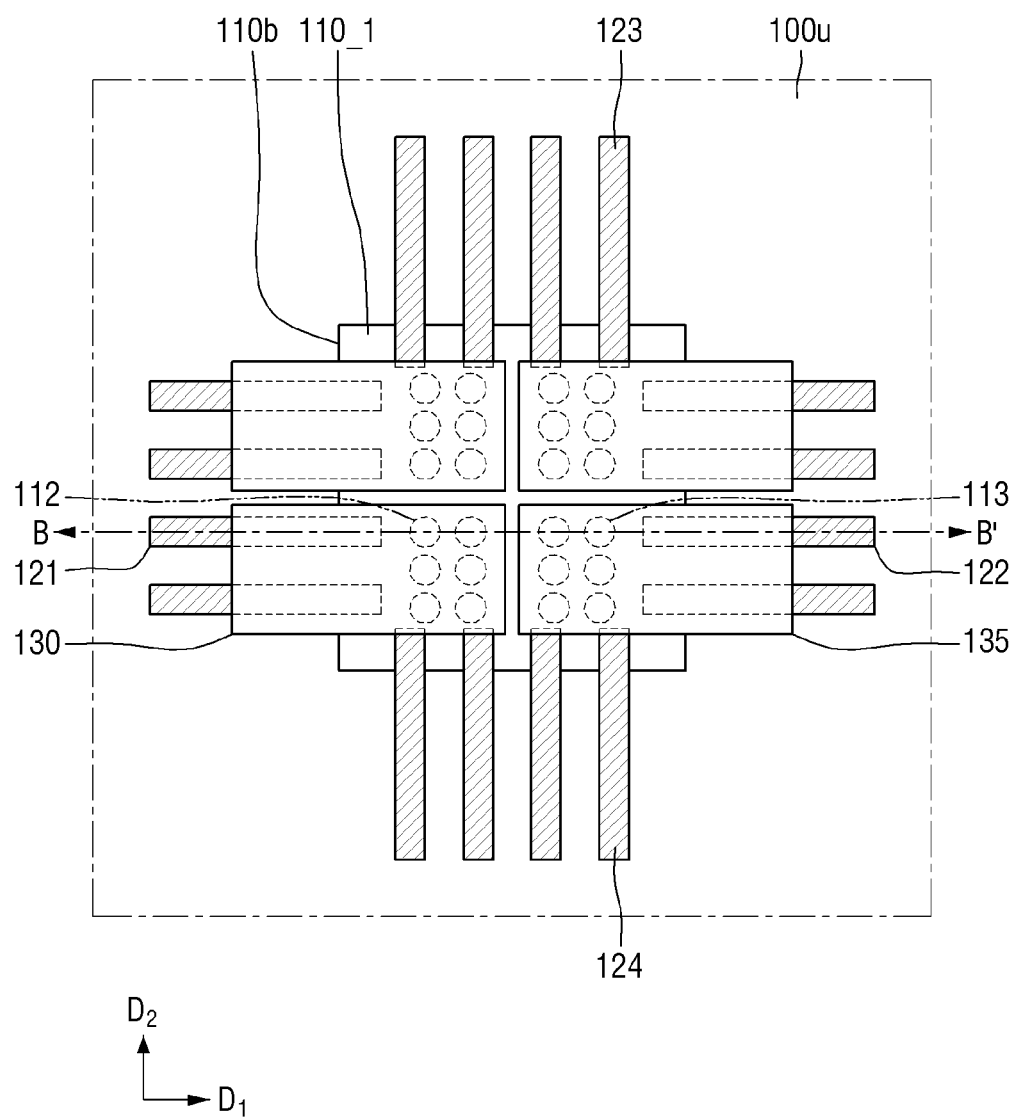
FIG. 4 is a top view of a semiconductor package according to some embodiments.
Figure 5:
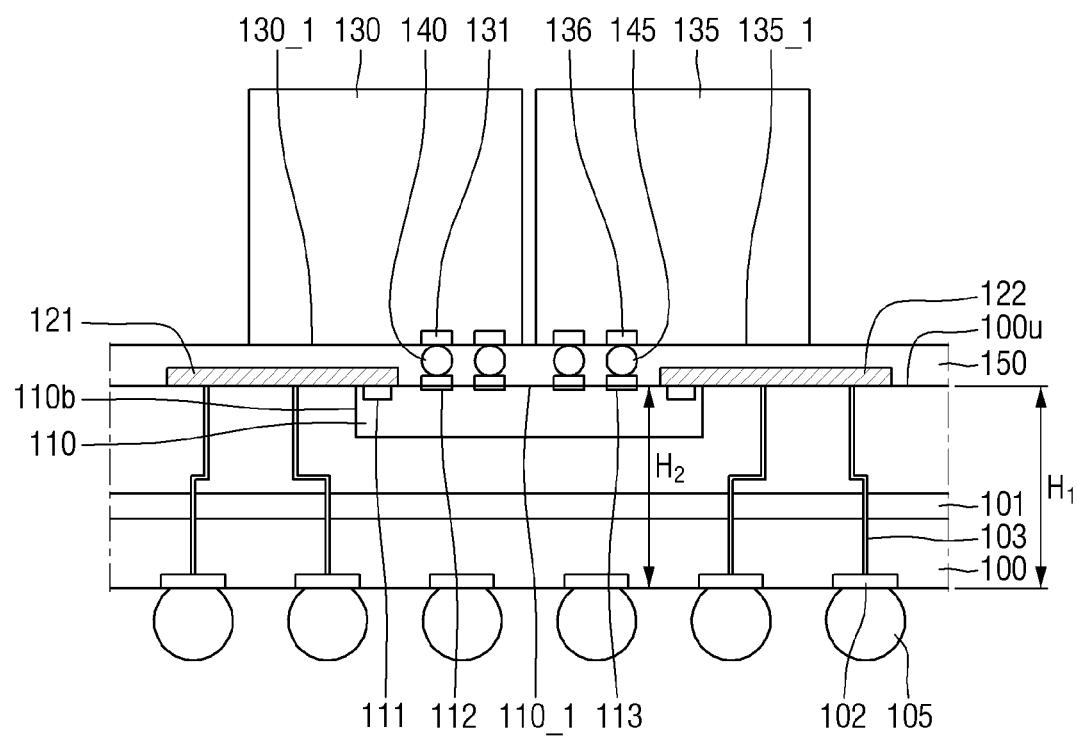
FIG. 5 is a cross-sectional view taken along line B-B' of FIG. 4.

Hereinafter, a semiconductor package according to some embodiments will be described with reference to FIGS. 4 and 5. For clarity of explanation, a redundant description is omitted herein. FIG. 4 is a top view of a semiconductor package according to some embodiments. FIG. 5 is a cross-sectional view taken along line B-B' of FIG. 4.

In some embodiments, the semiconductor package of FIGS. 4 and 5 may be similar to those described above with respect to FIGS. 1-3. However, the semiconductor package may include multiple semiconductor chips disposed on the first semiconductor chip 110. In particular, the second semiconductor chip 130 may be electrically connected to the first semiconductor chip 110 as described above. In addition, a third semiconductor chip 135 may be similarly electrically connected to the first semiconductor chip 110. For example, the third semiconductor chip 135 may include fifth pads 136 disposed on the third surface 135-1 of the third semiconductor chip 135. The third semiconductor chip 135 may be electrically connected to the first semiconductor chip 110 through a second connection terminal 145 connected to the third pads 113. For example, the second connection terminal 145 may electrically connect the third pads 113 of the first semiconductor chip 110 with the fifth pads 136 of the third semiconductor chip 135.

Although it has been illustrated in the drawings that the number of semiconductor chips including the second semiconductor chip 130 and the third semiconductor chip 135, which are disposed on the first semiconductor chip 110, is four, other embodiments may be different. For example, the number of semiconductor chips including the second semiconductor chip 130 and the third semiconductor chip 135, which are disposed on the first semiconductor chip 110, may be different from that shown in the drawings.

If the first semiconductor chip 110 and the third semiconductor chip 135 are electrically connected to each other, for example, through another medium, an RC delay and a signal delay may occur. In the semiconductor package according to some embodiments, by directly bonding the first semiconductor chip 110 and the third semiconductor chip 135 through pads disposed on the first surface 110_1 of the first semiconductor chip 110, it is possible to reduce the RC delay and the signal delay. Also, it is possible to reduce the thickness and the size of the semiconductor package.

As described above, as multiple semiconductor chips, such as the second and third semiconductor chips 130 and 135, may be electrically connected to the first semiconductor chip 110. In some embodiments, such semiconductor chips may be electrically connected to each other through the first semiconductor chip 110.

Figure 6A:
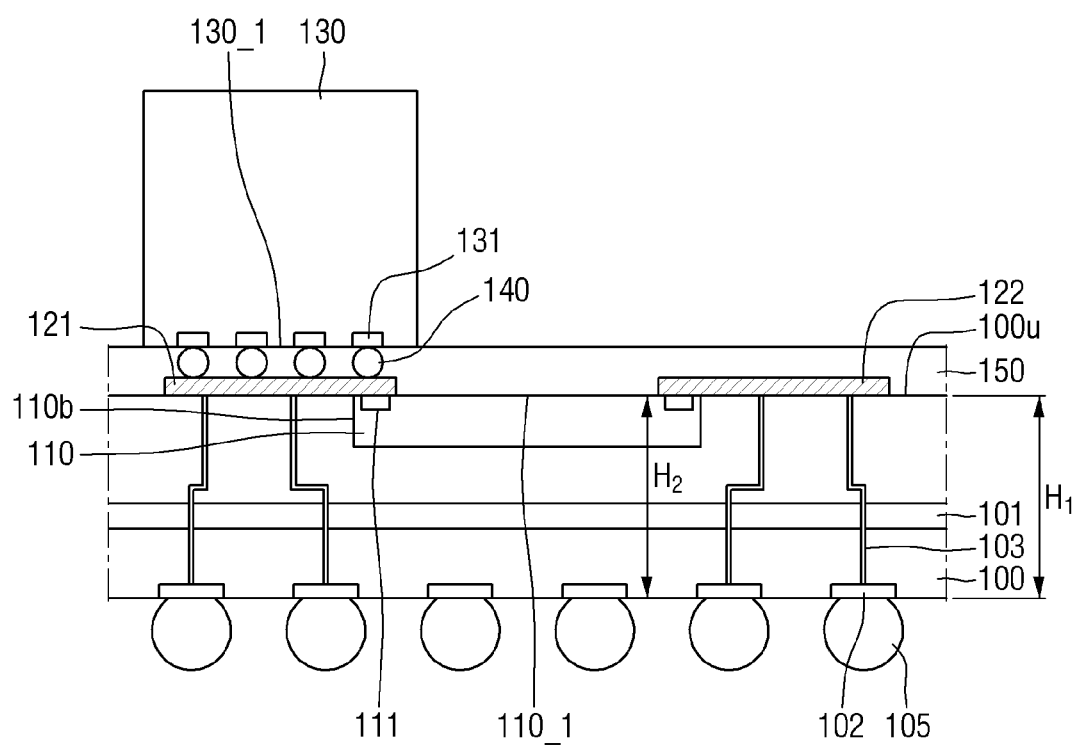
FIGS. 6A-C are cross-sectional views of semiconductor packages according to some embodiments.
Figure 6B:
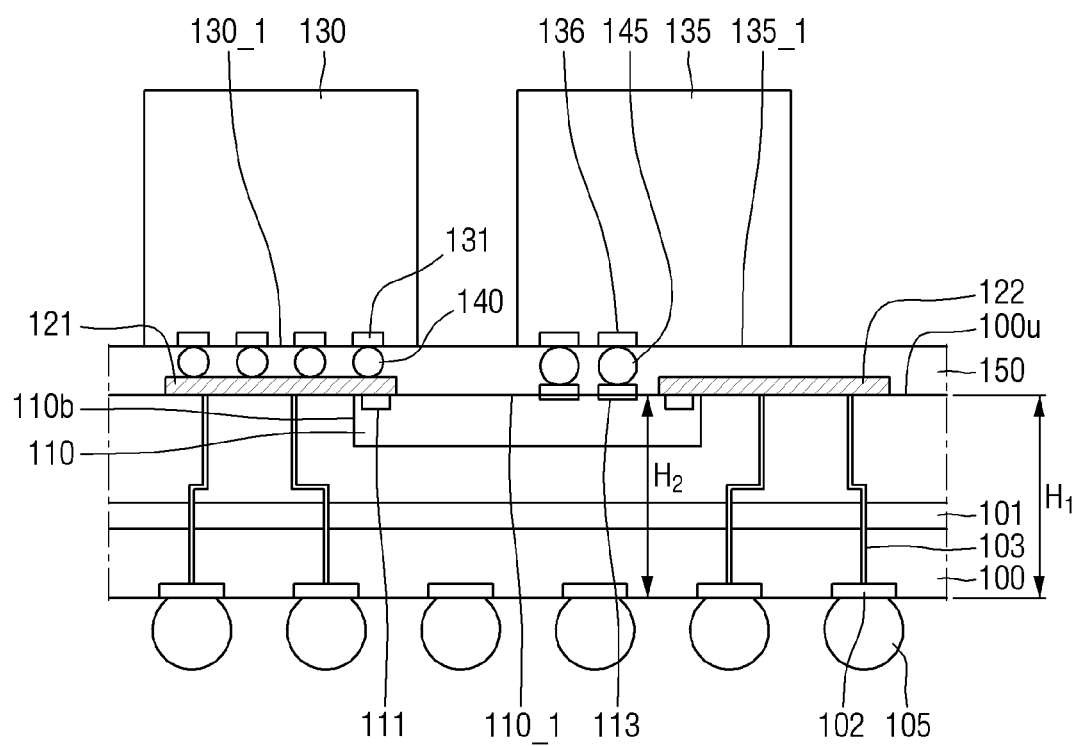
Figure 6C:
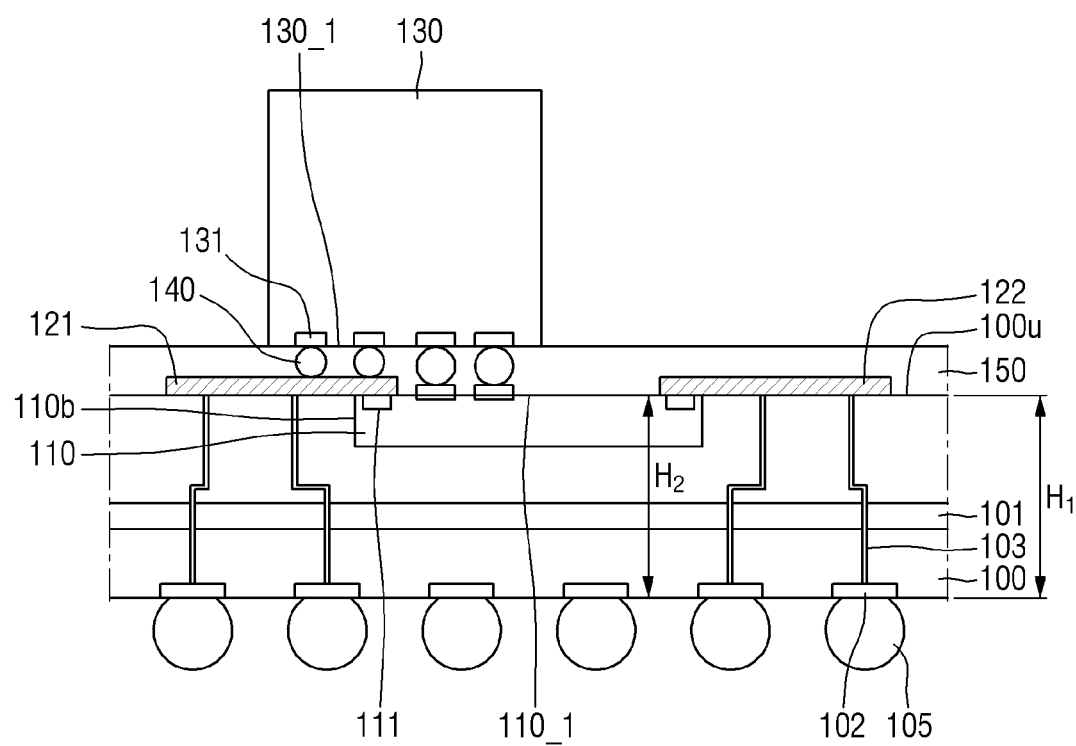

Hereinafter, a semiconductor package according to some embodiments will be described with reference to FIG. 6A-C. For clarity of explanation, a redundant description is omitted herein. FIGS. 6A-C are cross-sectional views of semiconductor packages according to some embodiments. Referring to FIG. 6A, in the semiconductor package according to some embodiments, the first connection terminal 140 may be in contact with the first metal line 121. The second semiconductor chip 130 may be disposed on the first metal line 121. The second surface 130_1 of the second semiconductor chip 130 may face the first metal line 121.

The pads that can directly bond the first semiconductor chip 110 with another semiconductor chip may not be disposed on the first semiconductor chip 110. For example, in some embodiments, the second pads 112 and the third pads 113 of FIG. 2 may not be disposed on the first semiconductor chip 110.

Although it has been illustrated in the drawings that only the second semiconductor chip 130 is disposed on the first metal line 121, other embodiments may be different. For example, another semiconductor chip may be also disposed on the second metal line 122 or on other metal lines.

The first metal line 121 may electrically connect the first semiconductor chip 110 with the substrate 100. The first metal line 121 may also electrically connect the second semiconductor chip 130 with the substrate 100. In addition, the first metal line 121 may electrically connect the second semiconductor chip 130 with the first semiconductor chip 110. More specifically, the first semiconductor chip 110 and the second semiconductor chip 130 may be electrically connected to each other through the first pads 111, the first metal line 121, the first connection terminal 140 and the fourth pads 131.

Although the second semiconductor chip 130 is illustrated as being electrically connected to a single first metal line 121 through fourth pads 131 and first connection terminals 140, other embodiments may be different. For example, one or more of the fourth pads 131 may be electrically connected to other first metal lines 121 through corresponding first connection terminals 140.

Referring to FIG. 6B, in some embodiments, one or more semiconductor chips may be electrically connected to the first metal line 121 while one or more other semiconductor chips may be not electrically connected to the first metal line 121. In particular, the semiconductor package includes a second semiconductor chip 130 electrically connected as described with respect to FIG. 6A. However, the semiconductor package also includes a third semiconductor chip 135 electrically connected as described with respect to FIG. 5.

Referring to FIG. 6C, in some embodiments, one or more semiconductor chips may include pads that are electrically connected to the first metal line 121 and other pads that are not electrically connected to the first metal line 121. In particular, the second semiconductor chip 130 may have some fourth pads 131 that are electrically connected to the first metal line 121 as described with respect to FIG. 6A. However, different fourth pads 131 of the second semiconductor chip 130 are electrically connected to the first semiconductor chip 110 as described with respect to FIG. 5.

Figure 7:
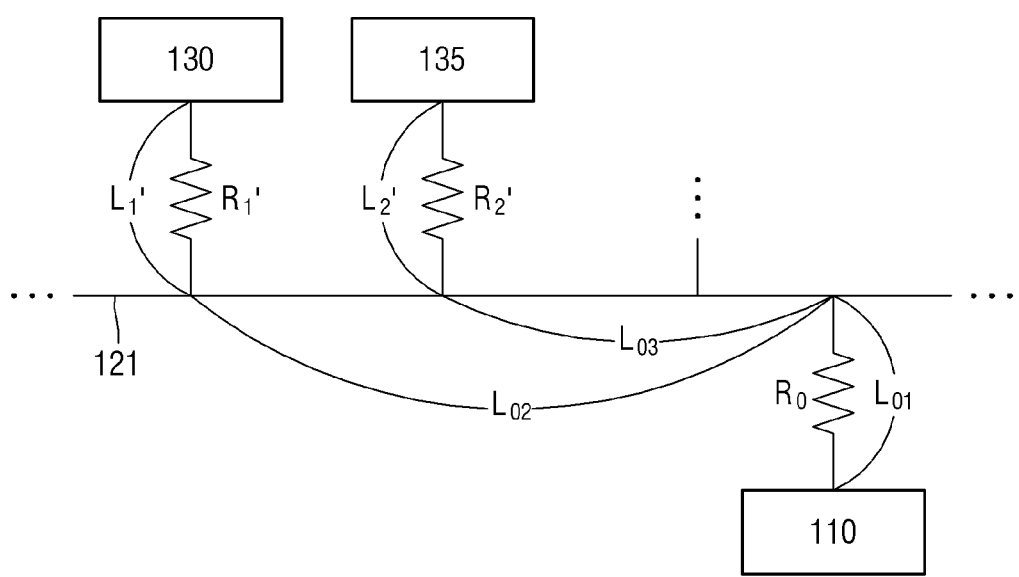
FIGS. 7 and 8 are diagrams for explaining an effect of a semiconductor package according to some embodiments, and are conceptual diagrams illustrating electrical connections between a first semiconductor chip and second and third semiconductor chips.
Figure 8:
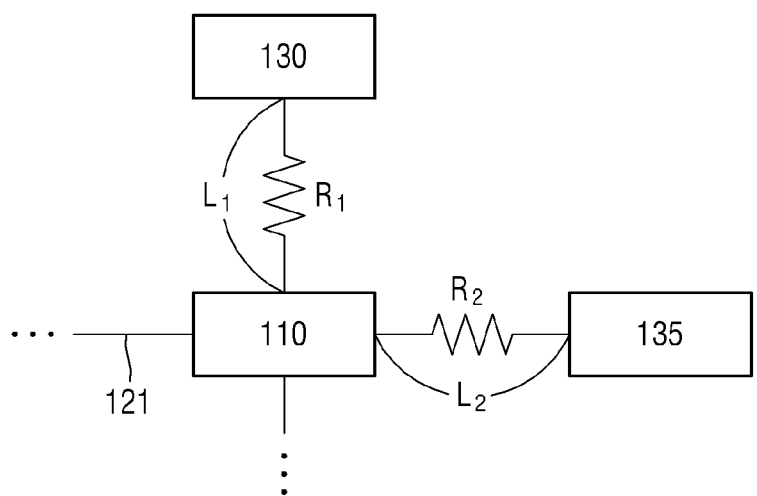

Hereinafter, a semiconductor package according to some embodiments will be described with reference to FIGS. 1 to 5, 7 and 8. For clarity of explanation, a redundant description is omitted herein. FIGS. 7 and 8 are diagrams for explaining an effect of a semiconductor package according to some embodiments, and are conceptual diagrams illustrating electrical connections between the first semiconductor chip and the second and third semiconductor chips. FIG. 7 illustrates a case where all of the first semiconductor chip 110, the second semiconductor chip 130 and the third semiconductor chip 135 are connected to the first metal line 121. In other words, FIG. 7 shows a case where the second and third semiconductor chips 130 and 135 and the first semiconductor chip 110 are electrically connected through the first metal line 121 rather than being directly bonded.

A wiring connecting the first semiconductor chip 110 with the first metal line 121 may have a resistance $R_0$. Further, the wiring connecting the first semiconductor chip 110 with the first metal line 121 may have a length $L_{01}$.

A wiring connecting the second semiconductor chip 130 with the first metal line 121 may have a resistance $R_{1'}$. Further, the wiring connecting the second semiconductor chip 130 with the first metal line 121 may have a length $L_{1'}$.

A wiring connecting the third semiconductor chip 135 with the first metal line 121 may have a resistance $R_{2'}$. Further, the wiring connecting the third semiconductor chip 135 with the first metal line 121 may have a length $L_{2'}$.

A length from a node at which the first semiconductor chip 110 is connected to the first metal line 121 to a node at which the second semiconductor chip 130 is connected to the first metal line 121 may be $L_{02}$.

A length from a node at which the first semiconductor chip 110 is connected to the first metal line 121 to a node at which the third semiconductor chip 135 is connected to the first metal line 121 may be $L_{03}$.

If the first semiconductor chip 110 and the second semiconductor chip 130 are electrically connected to each other, a total length of the wiring may be the sum of $L_{01}$, $L_{02}$ and $L_{1'}$. In this case, the resistance may be the sum of $R_0$ and $R_{1'}$ in addition to the resistance of the first metal line 121.

If the first semiconductor chip 110 and the third semiconductor chip 135 are electrically connected to each other, a total length of the wiring may be the sum of $L_{01}$, $L_{03}$ and $L_{2'}$. In this case, the resistance may be the sum of $R_0$ and $R_{2'}$ in addition to the resistance of the first metal line 121.

Referring to FIGS. 1 to 5 and 8, FIG. 8 illustrates a case where the first semiconductor chip 110 is directly bonded to the second and third semiconductor chips 130 and 135 according to some embodiments. In other words, as illustrated in FIGS. 1 to 5, the first semiconductor chip 110 and the second semiconductor chip 130 may be electrically connected to each other without using the first metal line 121. Further, the first semiconductor chip 110 and the third semiconductor chip 135 may be electrically connected to each other without using the first metal line 121.

A wiring connecting the second semiconductor chip 130 with the first semiconductor chip 110 may have a resistance $R_1$. Further, the wiring connecting the second semiconductor chip 130 with the first semiconductor chip 110 may have a length $L_1$.

A wiring connecting the third semiconductor chip 135 with the first semiconductor chip 110 may have a resistance $R_2$. Further, the wiring connecting the third semiconductor chip 135 with the first semiconductor chip 110 may have a length $L_2$.

When the first semiconductor chip 110 and the second semiconductor chip 130 are electrically connected to each other, a total length of the wiring may be $L_1$. In this case, the resistance may be $R_1$.

When the first semiconductor chip 110 and the third semiconductor chip 135 are electrically connected to each other, a total length of the wiring may be $L_2$. In this case, the resistance may be $R_2$.

Comparing FIGS. 7 and 8, the length $L_{1'}$ may be equal to the length $L_1$, and the resistance $R_{1'}$ may be equal to the resistance $R_1$. Therefore, when the first semiconductor chip 110 and the second semiconductor chip 130 are electrically connected to each other, a comparison of the lengths of the wirings may be $L_1 < L_{01} + L_{02} + L_{1'}$.

Further, the length $L_{2'}$ may be equal to the length $L_2$, and the resistance $R_{2'}$ may be equal to the resistance $R_2$. Therefore, when the first semiconductor chip 110 and the third semiconductor chip 135 are electrically connected to each other, a comparison of the lengths of the wirings may be $L_2 < L_{01} + L_{03} + L_{2'}$.

As the length of the wiring increases in a connection relationship of FIG. 7 compared to FIG. 8, the resistance may be increased. If the length and resistance are increased, for example, in the case of the connection relationship of FIG. 7, a signal delay and an RC delay may be increased.

In the semiconductor package according to some embodiments, by directly bonding the first semiconductor chip 110 and the second and third semiconductor chips 130 and 135 without using an intermediate medium, the signal delay and the RC delay can be reduced.

Figure 10:
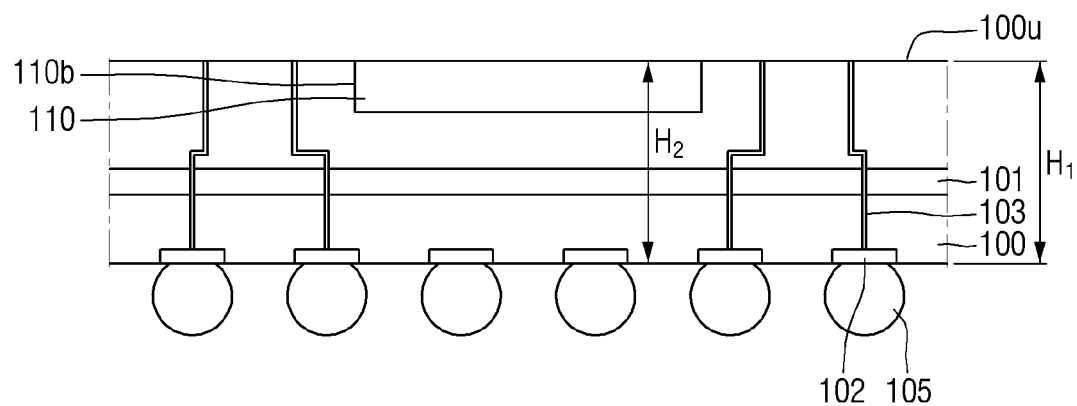
Figure 11:
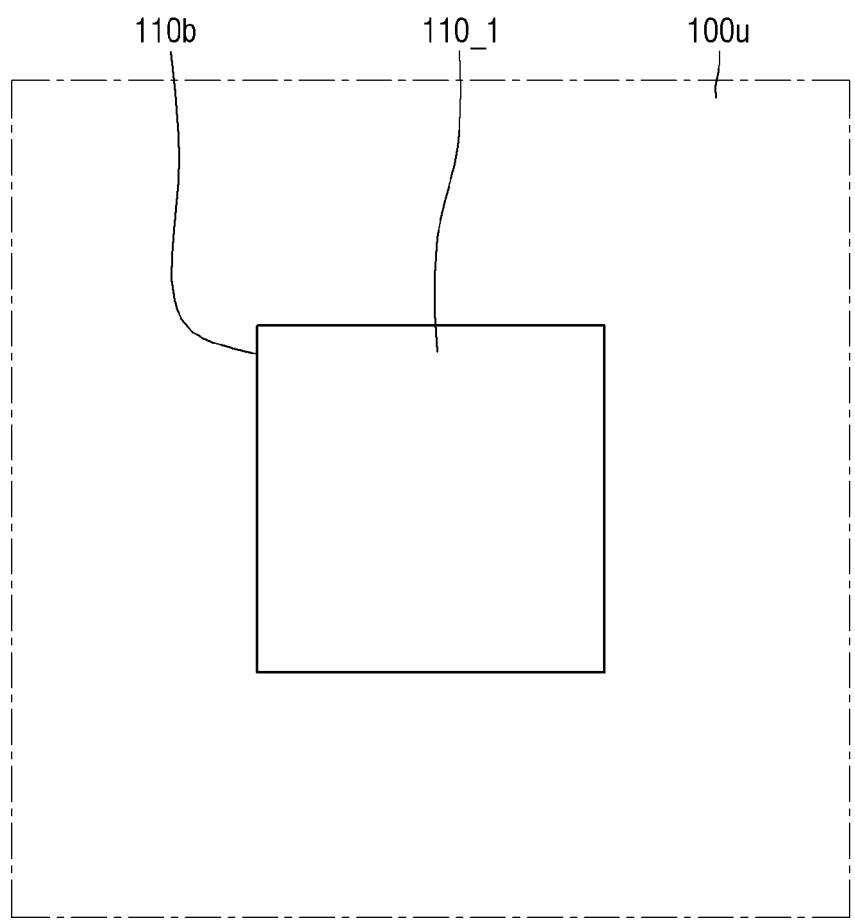
Figure 12:
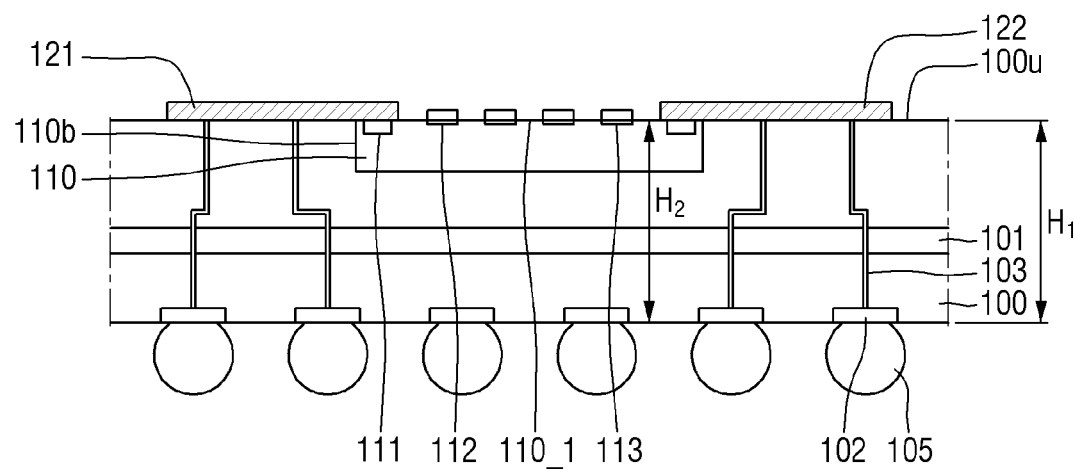
Figure 13:
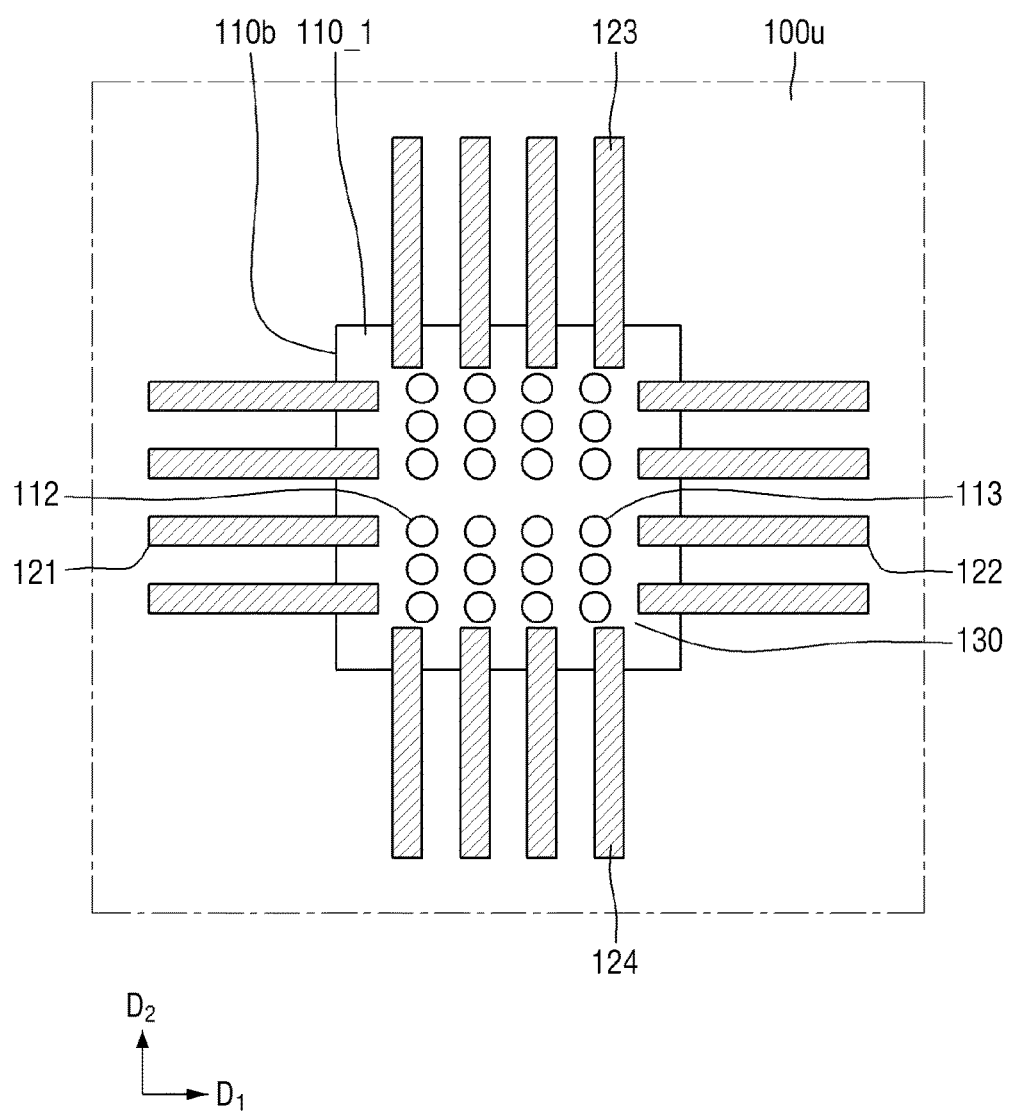

Hereinafter, a method for fabricating a semiconductor package according to some embodiments will be described with reference to FIGS. 1, 2 and 9 to 13. For clarity of explanation, a redundant description is omitted herein. FIGS. 9 to 13 illustrate the intermediate steps of a method for fabricating a semiconductor package according to some embodiments. FIGS. 9, 10 and 12 are cross-sectional views taken along line A-A' of FIG. 1. FIG. 11 is a plan view of FIG. 10. FIG. 13 is a plan view of FIG. 12.

Figure 9:
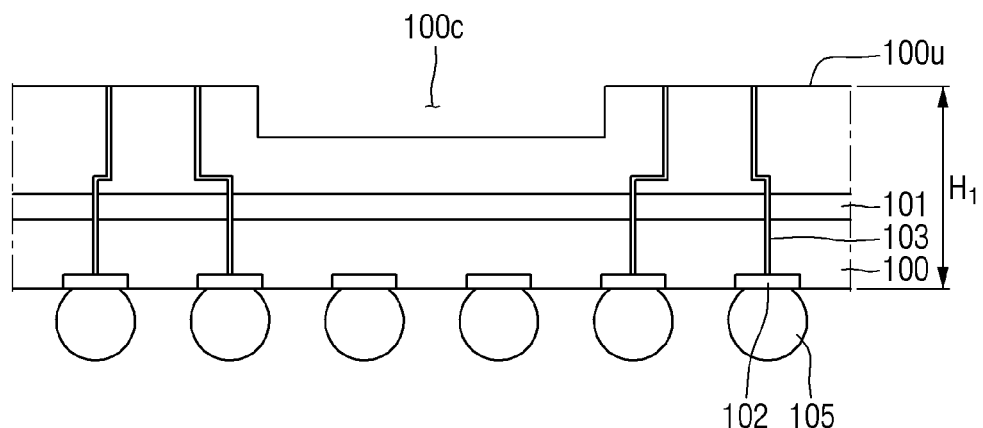
FIGS. 9 to 13 illustrate the intermediate steps of a method for fabricating a semiconductor package according to some embodiments.

Referring to FIG. 9, the substrate 100 may include the cavity 100-c formed in the substrate 100. The cavity 100-c may be formed by removing a portion of the substrate 100. The cavity 100-c may be formed on a surface opposite to one surface of the substrate 100 on which the external connection terminals 105 is formed. The height H1 from the lower surface of the substrate 100 to the upper surface 100U of the substrate 100 may be greater than a height from the lower surface of the substrate 100 to the lower surface of the cavity 100-c.

Referring to FIGS. 10 and 11, the first semiconductor chip 110 may be disposed in the cavity 100-c of the substrate 100. For example, the first semiconductor chip 110 may be fixed in the cavity 100-c using an adhesive material.

In some embodiments, the height of the cavity 100-c may be substantially equal to the height of the first semiconductor chip 110. In this case, the height of the cavity 100-c may be a height from the bottom surface of the cavity 100-c to the upper surface 100U of the substrate 100. Further, the height of the first semiconductor chip 110 may be a height from the bottom surface of the first semiconductor chip 110 to the first surface 110_1 of the first semiconductor chip 110. However, other embodiments may be different. For example, the height of the cavity 100-c may be different from the height of the first semiconductor chip 110.

As the first semiconductor chip 110 is disposed in the cavity 100-c, the height H1 from the lower surface of the substrate 100 to the upper surface 100U of the substrate 100 may be substantially equal to the height H2 from the lower surface of the substrate 100 to the first surface 110_1 of the first semiconductor chip 110. In this case, the lower surface of the substrate 100 may be a portion where the lower pads 102 and the external connection terminals 105 are formed.

Referring to FIGS. 12 and 13, the first metal line 121, the second metal line 122, the second pads 112 and the third pads 113 may be formed at the same time. The first pads 111 may be formed, for example, before the formation of the first metal line 121, the second metal line 122, the second pads 112 and the third pads 113, but other embodiments may be different.

The first metal line 121, the second metal line 122, the second pads 112 and the third pads 113 may be formed using, e.g., electrolytic/electroless plating, laser metal patterning, metal printing or the like. However, other embodiments may be different. For example, any technique or techniques capable of forming the first metal line 121, the second metal line 122, the second pads 112 and the third pads 113 on the substrate 100 and the first semiconductor chip 110 may be used appropriately.

Referring again to FIGS. 1-6, the second semiconductor chip 130 may be mounted on the first semiconductor chip 110 in the form of a flip chip.

While embodiments has been particularly shown and described with reference to the drawings, it will be understood by those of ordinary skill in the art that various changes in form and details may be made therein without departing from the spirit and scope as defined by the following claims. It is therefore desired that the particular embodiments described herein be considered in all respects as illustrative and not restrictive.

What is claimed is:

1. A semiconductor package comprising:
a substrate including an external connection terminal, a cavity and one or more vias connected to the external connection terminal and the one or more vias being disposed in the substrate;
a first semiconductor chip disposed in the cavity, the first semiconductor chip including a first pad and a second pad different from the first pad, the first pad and the second pad being disposed on a first surface of the first semiconductor chip;
a metal line disposed on the substrate and the first semiconductor chip and electrically connecting the first pad of the first semiconductor chip with the external connection terminal of the substrate;
a second semiconductor chip disposed on the first semiconductor chip, the second semiconductor chip including a third pad disposed on a second surface of the second semiconductor chip facing the first semiconductor chip; and
a plurality of connection terminals electrically connecting the second pad of the first semiconductor chip with the third pad of the second semiconductor chip, and interposed between the first semiconductor chip and the second semiconductor chip,
wherein all of the plurality of the connection terminals interposed between the first semiconductor chip and the second semiconductor chip are not in direct contact with the metal line, and
wherein the second semiconductor chip is not connected to any one of all of the one or more vias.

2. The semiconductor package of claim 1, wherein the metal line includes a material different from a material included in the second pad.

3. The semiconductor package of claim 1, wherein the metal line is disposed on a boundary between the substrate and a sidewall of the first semiconductor chip.

4. The semiconductor package of claim 1,
wherein the all of the plurality of the connection terminals are in direct contact with the second pad.

5. The semiconductor package of claim 1, wherein the metal line is disposed on a portion of the first surface of the first semiconductor chip and an upper surface of the substrate.

6. The semiconductor package of claim 5,
wherein the metal line is in direct contact with the first pad of the first semiconductor chip and the upper surface of the substrate.

7. A semiconductor package comprising:
a substrate including a cavity;
a first semiconductor chip disposed in the cavity, the first semiconductor chip including a first pad, a second pad, and a third pad disposed on an upper surface of the first semiconductor chip, wherein the second pad and the third pad different from the first pad;
a metal line disposed on the substrate and the first semiconductor chip and electrically connected to the first pad of the first semiconductor chip and the substrate;
a second semiconductor chip disposed on the first semiconductor chip and electrically connected to the first semiconductor chip through a first connection terminal connected to the second pad;

a third semiconductor chip disposed on the first semiconductor chip, spaced apart from the second semiconductor chip, and electrically connected to the first semiconductor chip through a second connection terminal connected to the third pad; and a plurality of connection terminals interposed between the first semiconductor chip and the second semiconductor chip and between the first semiconductor chip and the third semiconductor chip, and includes the first connection terminal and the second connection terminal, wherein all of the plurality of the connection terminals interposed between the first semiconductor chip and the second semiconductor chip and between the first semiconductor chip and the third semiconductor chip are not in direct contact with the metal line.

8. The semiconductor package of claim 7, wherein the metal line includes a material different from a material included in the second pad and the third pad.

9. The semiconductor package of claim 7, wherein the metal line is disposed on a boundary between the substrate and a sidewall of the first semiconductor chip.

10. The semiconductor package of claim 7,
wherein the first connection terminal is in direct contact with the second pad, and
wherein the second connection terminal is in direct contact with the third pad.

11. The semiconductor package of claim 7, wherein the metal line is in direct contact with an upper surface of the substrate and the first pad.

12. The semiconductor package of claim 7, wherein a height from a lower surface of the substrate to an upper surface of the substrate is equal to a height from the lower surface of the substrate to the upper surface of the first semiconductor chip.

13. The semiconductor package of claim 7, wherein:
the first semiconductor chip is connected to the second semiconductor chip through the second pad, the first connection terminal and a fourth pad of the second semiconductor chip; and
the first semiconductor chip is connected to the third semiconductor chip through the third pad, the second connection terminal and a fifth pad of the third semiconductor chip.

14. A semiconductor package, comprising:
a substrate including an external connection terminal and one or more vias connected to the external connection terminal and the one or more vias being disposed in the substrate;

a first semiconductor chip including a first pad and at least one second pad;

at least one second semiconductor chip disposed on the first semiconductor chip, wherein each of the at least one second semiconductor chip is electrically connected to the first semiconductor chip through a corresponding one of the at least one second pad;

a metal line electrically connected to the first pad; and a plurality of connection terminals electrically connecting the first semiconductor chip and the at least one second semiconductor chip and interposed between the first semiconductor chip and the at least one second semiconductor chip, wherein the first semiconductor chip and the at least one second semiconductor chip are connected directly without through the metal line, wherein all of the plurality of connection terminals interposed between the first semiconductor chip and the at least one second semiconductor chip are not in direct contact with the metal line, and wherein the second semiconductor chip is not connected to any one of all of the one or more vias.

15. The semiconductor package of claim 14, wherein:
the at least one second semiconductor chip comprises a plurality of second semiconductor chips;
the at least one second pad comprises a plurality of second pads; and
each of the second semiconductor chips is electrically connected to the first semiconductor chip through a corresponding one of the second pads.

16. The semiconductor package of claim 14, further comprising a third semiconductor chip electrically connected to the first semiconductor chip through the metal line.

17. The semiconductor package of claim 14, further comprising an insulating film disposed between the first semiconductor chip and the at least one second semiconductor chip.

18. The semiconductor package of claim 14, wherein the substrate further comprises an external connection terminal electrically connected to the first semiconductor chip through the metal line.

19. The semiconductor package of claim 14, wherein:
the substrate includes an upper surface;
the metal line is disposed on the upper surface of the substrate;
the first semiconductor chip includes an upper surface;
the first pad is disposed at the upper surface of the first semiconductor chip; and
the upper surface of the substrate is coplanar with the upper surface of the first semiconductor chip.

* * * * *